(12) United States Patent
Davies et al.

(10) Patent No.: US 10,326,450 B2
(45) Date of Patent: Jun. 18, 2019

(54) IMPLEMENTING CASCADE LEVEL SHIFTER FOR ANALOG VOLTAGE

(71) Applicant: International Business Machines Corporation, Armonk, NY (US)

(72) Inventors: Andrew D. Davies, Rochester, MN (US); David M. Friend, Rochester, MN (US); Grant P. Kesselring, Rochester, MN (US); James D. Strom, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 43 days.

(21) Appl. No.: 15/617,635

(22) Filed: Jun. 8, 2017

(65) Prior Publication Data

US 2018/0358969 A1  Dec. 13, 2018

(51) Int. Cl.
*H03K 19/0185* (2006.01)
(52) U.S. Cl.
CPC .......................... *H03K 19/018521* (2013.01)
(58) Field of Classification Search
None
See application file for complete search history.

(56) References Cited

U.S. PATENT DOCUMENTS

| | | | |
|---|---|---|---|
| 5,483,176 A * | 1/1996 | Rodriguez | H03K 19/0013 326/21 |
| 5,808,480 A * | 9/1998 | Morris | H03K 19/018521 326/81 |
| 6,118,266 A | 9/2000 | Manohar et al. | |
| 6,924,689 B2 | 8/2005 | Randazzo et al. | |
| 7,030,654 B2 | 4/2006 | Mentze et al. | |
| 7,183,817 B2 | 2/2007 | Sanchez et al. | |
| 7,221,192 B1 | 5/2007 | Talbot | |
| 7,233,274 B1 | 6/2007 | Kuhn | |
| 8,169,234 B1 | 5/2012 | Bourstein | |
| 2002/0154044 A1 | 10/2002 | Blankenship et al. | |
| 2010/0321083 A1* | 12/2010 | Chen | H03K 19/018521 327/333 |

FOREIGN PATENT DOCUMENTS

EP  1137184 A1  9/2001

* cited by examiner

*Primary Examiner* — Long Nguyen
(74) *Attorney, Agent, or Firm* — Joan Pennington

(57) ABSTRACT

A method and circuit for implementing a level shifter for translating logic signals to output voltage analog levels, and a design structure on which the subject circuit resides are provided. The circuit includes a level shifter resistor divider string of a plurality of series connected resistors, the level shifter resistor divider string is connected between an analog voltage rail and an analog ground. A plurality of level shifter cascaded inverters are connected between respective resistors of the level shifter resistor divider string and an analog voltage rail and an analog ground. An output of the level shifter is programmed by the level shifter resistor divider string connected to the cascaded inverters.

20 Claims, 15 Drawing Sheets

IMPLEMENTING CASCADE LEVEL SHIFTER FOR ANALOG VOLTAGE

FIELD OF THE INVENTION

The present invention relates generally to the data processing field, and more particularly, relates to a method and circuit for implementing a level shifter for translating logic signals to output voltage analog levels, and a design structure on which the subject circuit resides.

DESCRIPTION OF THE RELATED ART

Voltage levels at the outputs of the existing level shifters often are too extreme and risk overvoltage to downstream circuits. Current level shifters translate VDD logic signals to Analog VDD (AVDD) voltages, having output voltages between 0 volts and AVDD volts, such as 1.2, and 1.8 volts, which can stress the transmission gate or pass gate devices in the level shifter and a connected Analog multiplexer (AMUX). Normal output voltages can be, for example, 1.2 volts and an output of 0 volts, can cause an over-voltage between the gate, source and/or drain of a pass gate in the level shifter or AMUX.

FIG. 7 illustrates a prior art level shifter 700 and FIGS. 8A, 8B, and 8C illustrate example voltages of the prior art level shifter. Existing level shifter 700 has transistors in the level shifter as well as devices connected to the level shifter having a maximum voltage that can be exceeded in the case of a driving supply voltage VDD being off. While the AVDD output voltage is on and during power supply ramping, the output voltage of the level shifter 700 can go between AVDD and ground GA. Typically current level shifters and level shifter 700 have indeterminate voltages if the driving power supply is off and when the VDD power supply is low.

Additionally the greater voltage between the low level of the level shifter and the gate of the pass gate causes higher leakage currents to flow, for example, between legs of the AMUX, which can cause unwanted feedback paths to occur between different legs of the AMUX and the circuits connected to the AMUX.

This problem is worse in 14 nm and 10 nm technologies providing thin oxide field effect transistor (FETs), where thick oxide FETs are not available for use, for example in the level shifter, and selection circuitry of the AMUX and bandgap circuits. Thick oxide FETs have higher voltage limits and lower leakage currents than thin oxide devices, which are limited to about 1.15 V.

A need exists for an enhanced level shifter circuit providing effective voltage translation and overvoltage protection for thin oxide devices.

SUMMARY OF THE INVENTION

Principal aspects of the present invention are to provide a method and circuit for implementing a level shifter for translating logic signals to output voltage analog levels, and a design structure on which the subject circuit resides. Other important aspects of the present invention are to provide such method and circuit substantially without negative effects and that overcome some disadvantages of prior art arrangements.

In brief, a method and circuit for implementing a level shifter for translating logic signals to output voltage analog levels, and a design structure on which the subject circuit resides are provided. The circuit includes a level shifter resistor divider string of a plurality of series connected resistors, the level shifter resistor divider string is connected between an analog voltage rail and an analog ground. A plurality of level shifter cascaded inverters are connected between respective resistors of the level shifter resistor divider string and an analog voltage rail and an analog ground. An output of the level shifter is programmed by the level shifter resistor divider string connected to the cascaded inverters.

In accordance with features of the invention, the level shifter limits an output level of Analog VDD (AVDD) voltages so that the voltage across the pass gates is low enough to turn on PFETs and turn off NFETs and high enough to turn on NFETs and turn off PFETs, while pass gates would not see an overvoltage condition, leakage and voltage stress on the transistors.

In accordance with features of the invention, the cascaded inverters steps the voltage up, for example, by voltage between resistor divider string tap points.

In accordance with features of the invention, the cascaded inverters are formed by respective series connected P-channel field effect transistor (PFET) and N-channel field effect transistor (NFET) pairs connected between respective resistors of the level shifter resistor divider string. The cascaded inverters include thin oxide field effect transistor (FETs).

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

Figure 1A:
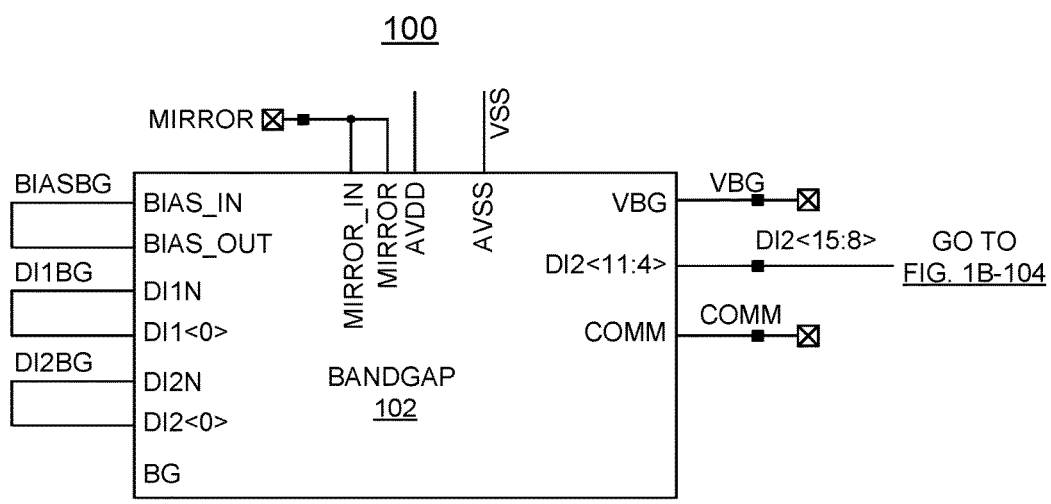
FIGS. 1A, 1B, 1C and 1D and FIGS. 2A, 2B, and 2C provide respective schematic diagram representations of a circuit for implementing a level shifter for translating logic signals to output voltage analog levels in accordance with the preferred embodiment.

In the following detailed description of embodiments of the invention, reference is made to the accompanying drawings, which illustrate example embodiments by which the invention may be practiced. It is to be understood that other embodiments may be utilized and structural changes may be made without departing from the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In accordance with features of the invention, a method and a circuit for implementing a level shifter for translating logic signals to output voltage analog levels, and a design structure on which the subject circuit resides are provided.

Having reference now to the drawings, in FIGS. 1A, 1B, 1C and 1D and FIGS. 2A, 2B, and 2C, there is shown an example circuit for implementing a level shifter for translating logic signals to output voltage analog levels in accordance with a preferred embodiment generally designated by the reference character 100. The circuit 100 enables effective voltage translation while providing effective overvoltage protection.

Figure 1B:
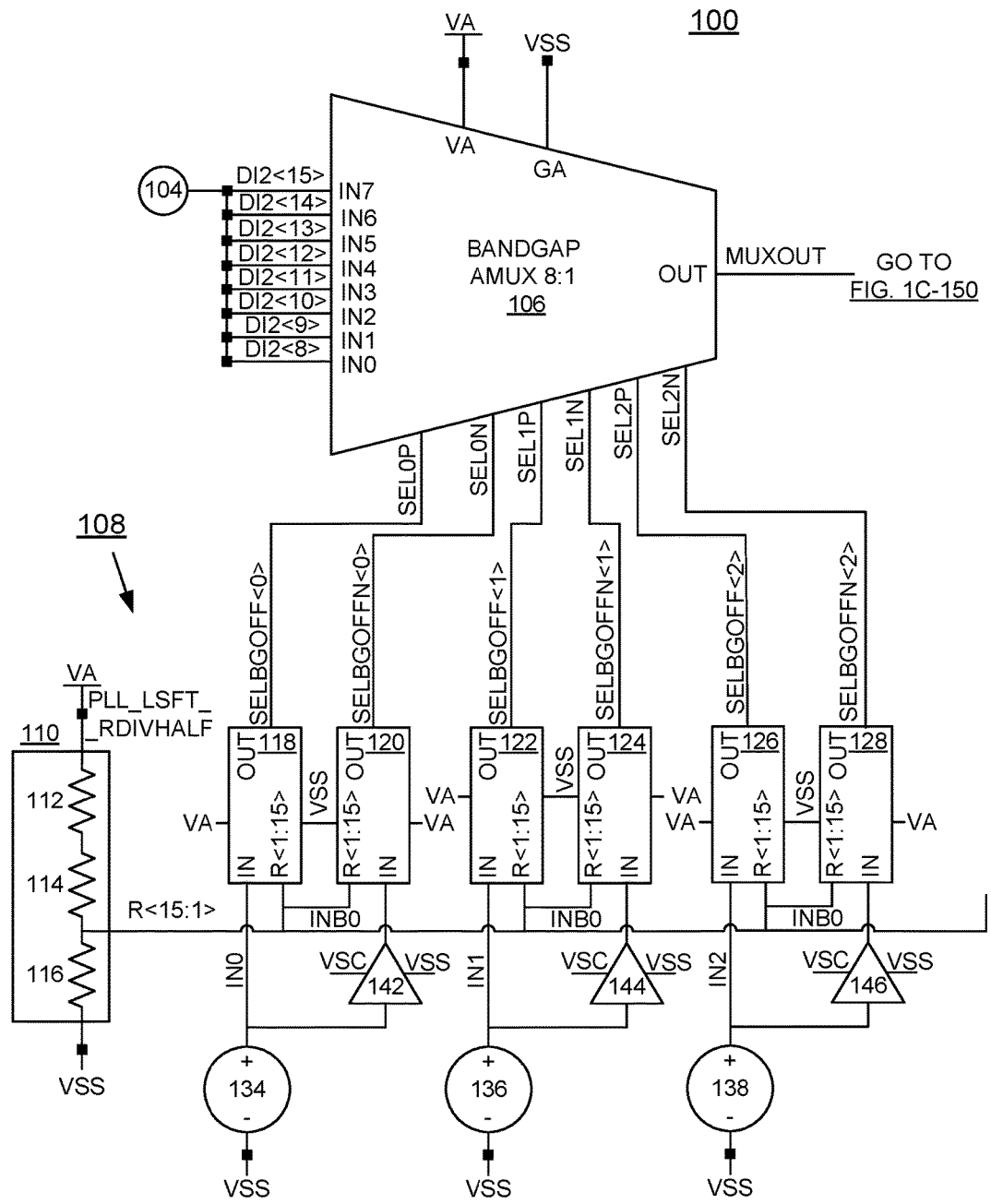

In FIG. 1A, circuit 100 includes a bandgap (BGAP) 102 in accordance with the preferred embodiment coupled to FIG. 1B at 104. In FIG. 1B, circuit 100 includes a bandgap Analog multiplexer (AMUX) 106 and level shifters (LSHFT) 108 generally designated by the reference character 108. As shown in FIG. 1B the BGAP 102 has a series of outputs D12<15:8> from an internal resistor string.

Figure 1C:
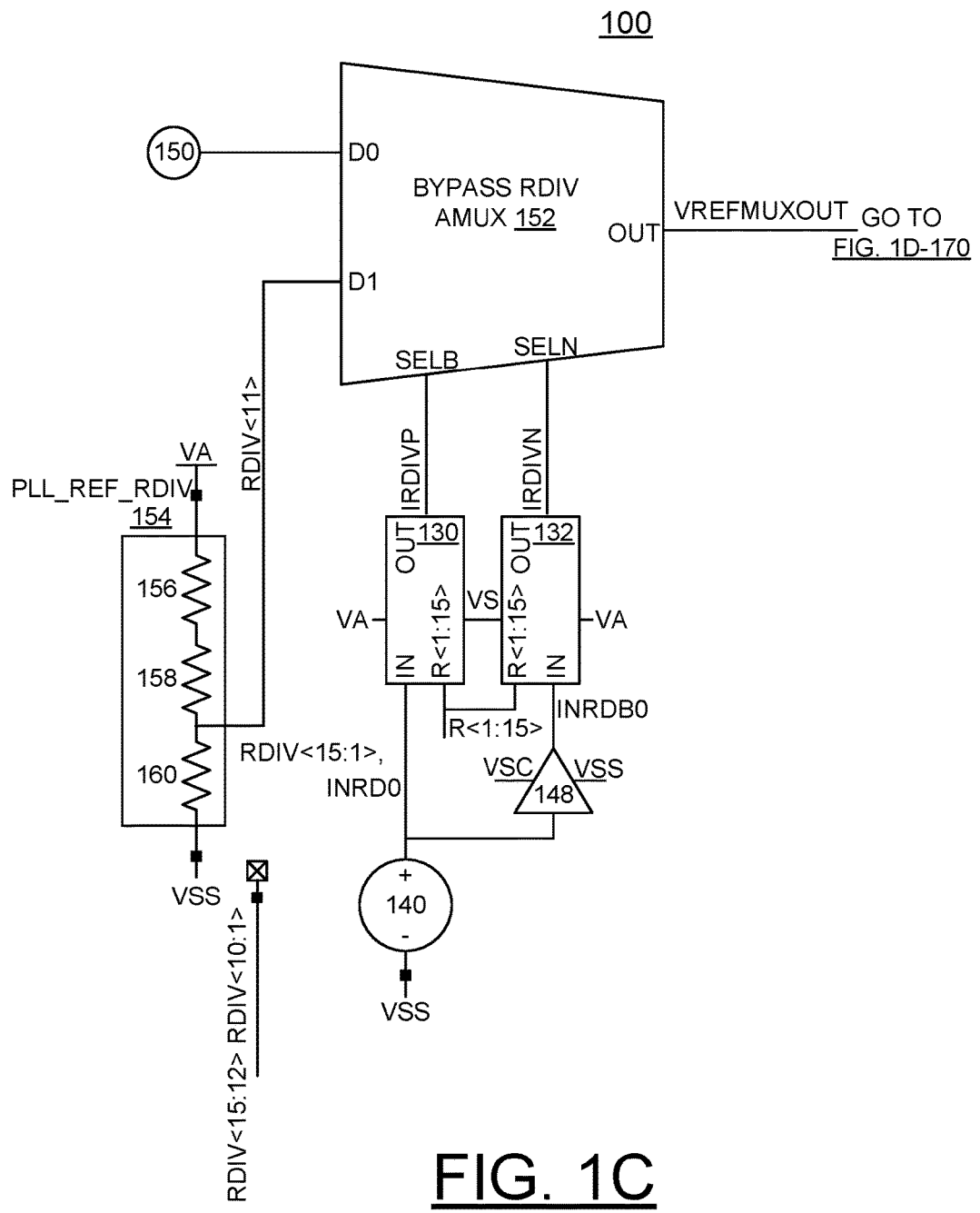

As shown in FIGS. 1B and 1C, LSHFT 108 includes a resistor voltage divider 110 formed by a plurality of resistors 112, 114, 116 connected between voltage rails VSS, VA including a connection to the reference level R<15:1> applied to a respective input INB0 or R<15:1> of logic functions 118, 120, 122, 124, 126, 128, 130, 132, each connected between voltage rails VSS, VA. A respective input IN of logic functions 118, 122, 126, 130 is connected to a respective source 134, 136, 138, 140 with the respective input IN of logic functions 120, 124, 128, 132 connected to an inverted source output of a respective inverter 142, 144, 146, 148. Logic functions 118, 120, 122, 124, 126, 128 provide respective outputs SELBGOFF <0>, SELBGOFFN <0>, SELBGOFF <1>, SELBGOFFN <1>, SELBGOFF <2>, SELBGOFFN <2> that are applied to select inputs SEL0P, SEL0N, SEL1P, SEL1N, SEL2P, and SEL2N of the bandgap AMUX 106. Logic functions 130, 132 provide respective outputs IRDIVP, IRDIVN to select inputs SELP, SELN of a bypass Resistor Divider (RDIV) AMUX 152.

In FIG. 1C, a D0 input of the bypass RDIV AMUX 152 receives a MUXOUT of bandgap AMUX 106 coupled to FIG. 1C at 150. LSHFT 108 includes a resistor voltage divider 154 formed by a plurality of resistors 156, 158, 160 connected between voltage rails VSS, VA including a connection to the reference level RDIV<15:1> applied to a D1 input of the bypass RDIV AMUX 152.

Figure 1D:
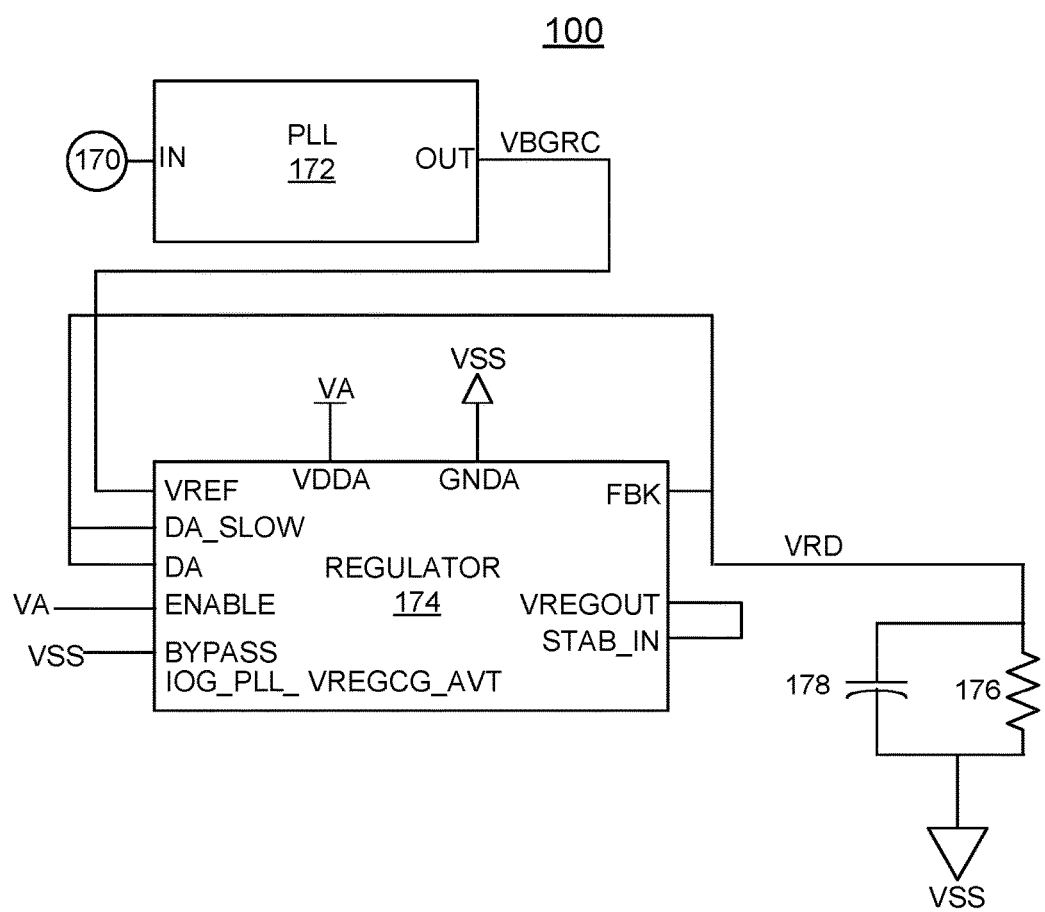

In FIG. 1D, an output of the bypass RDIV AMUX 152 is applied to an input IN of the PLL 172 at 170 of FIG. 1D. PLL 172 provides an output VBGRC to an input VREF of the regulator 174. Regulator 174 includes an enable input coupled VA. A feedback FBK of regulator 174 at VRD is applied to regulator inputs DA_SLOW and DA and is coupled to a parallel resistor 176 and capacitor 178 connected to ground VSS.

In FIG. 1A, the outputs of BGAP 102 range, for example, from 1.25-0.8 (D12<15:8>) Volts and go into the bandgap AMUX 106, which selects a tap of the resistor string applied via the bypass Resistor Divider (RDIV) AMUX 152 in FIG. 1C so that a Phase-Locked-Loop (PLL) 172 of FIG. 1D can pick different voltages to feed to a regulator 174 of FIG. 1D. In FIG. 1C, a Resistor Divider (RDIV) generally designated by a reference character 154 goes to the bypass RDIV AMUX 152, which optionally select a RDIV reference to the regulator 174 rather than the bandgap AMUX 106, used for example with a start-up problem with BGAP 102, and so that the input to the regulator 174 can be varied by changing the AVDD supply.

In accordance with features of the invention, the AMUX 106 is controlled with reduced voltage swings and voltages around the 1.2 volts of the BGAP 102 and RDIV 154 making the PLL 174 more reliable and robust. The output voltages track the AVDD so that a low output voltage is avoided with an indeterminate VDD or input. As a result, FETs (not shown) in the bandgap AMUX 106 do not have 1.5 V (AVDD) across any of their junctions.

In accordance with features of the invention, the level shifter for VDD logic (~1 Volt (V)) signals to Analog VDD (>1.15V) for implementing programmable BGAP voltages and selecting bandgap bypass resistor and resistor dividers and controlling select lines of the bandgap AMUX 106 using only thin oxide FETS in a reliable manner that minimizes the chances of overvoltage occurring. The low level of the output of the level shifter is programmed by a resistor divider string connected to the inverters of the level shifter so that the voltage across the pass gates is low enough to turn on the PFET and turn off the NFET and turn off PFET and turn of the NFET in the AMUX 106, but not low or high enough so that pass gates would see an overvoltage condition or higher leakage.

Figure 3:
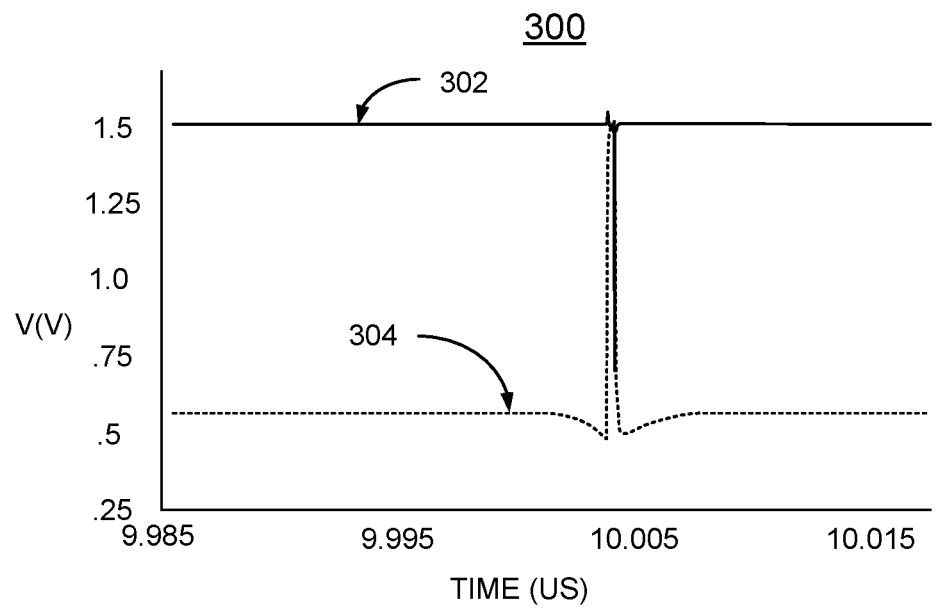
FIGS. 3 and 4 illustrate example voltage outputs of the level shifter in accordance with the preferred embodiment.
Figure 4:
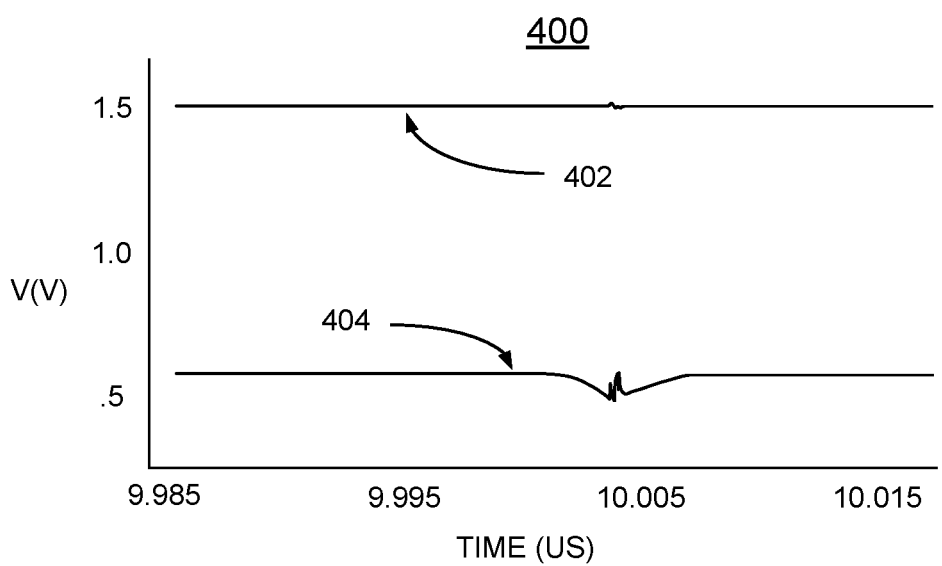

In accordance with features of the invention, the method of level shifting provides reliably shifting from VDD to AVDD without exceeding the voltage specification for a thin oxide devices. The level shifter only requires AVDD voltage, providing effective and reliable operation when the source VDD power supply is at 0 volts, for example, as illustrated in FIGS. 3 and 4.

Figure 2A:
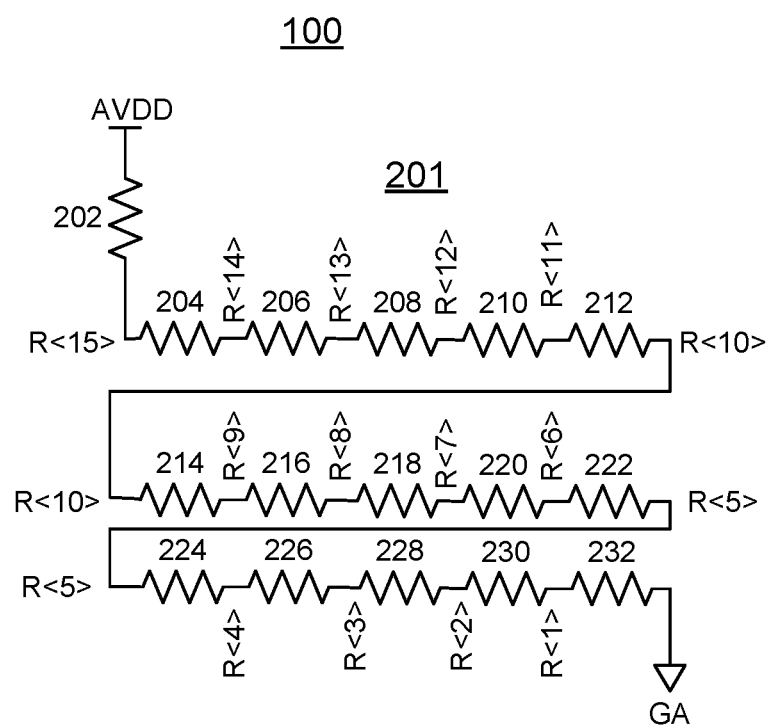

Referring now to FIG. 2A, circuit 100 includes a level shifter resistor divider string 201 of resistors 202, 204, 206, 208, 210, 212, 214, 216, 218, 220, 222, 224, 226, 228, 230, 232 connected between voltage rails AVDD, GA. The level shifter resistor divider string 201 provides N tap points in this example 15, R<1>-R<15> is fabricated between ground GA or analog ground and the Analog power supply (AVDD). For example , for AVDD=1.5V, the level shifter resistor divider string 201 of 16 resistors results in approximately 100 mV steps in between the resistor divider string tap points R<1>-R<15>.

Figure 2B:
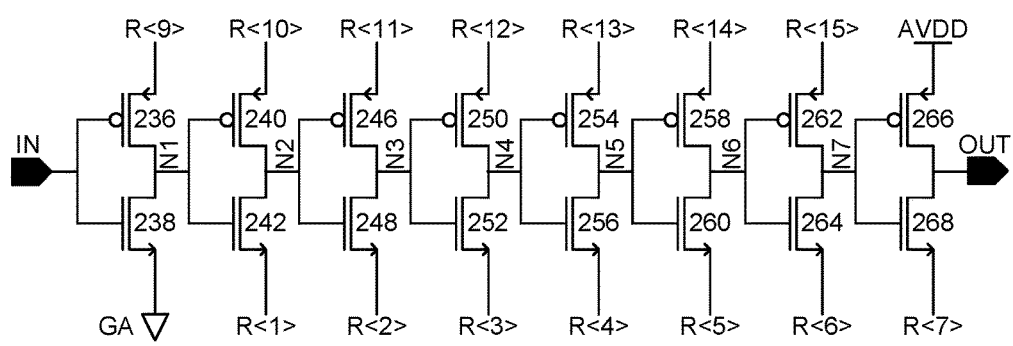

Referring now to FIG. 2B, circuit 100 includes level shifter cascaded inverters generally designated by reference character 234. The level shifter cascaded inverters 234 are formed by respective P-channel field effect transistor (PFET) and N-channel field effect transistor (NFET) pairs 236, 238; 240, 242; 246, 248; 250, 252; 254, 256; 258, 260; 262, 264; and 266, 268, as shown. Each inverter PFET, NFET pair providing a respective outputs N1, N2, N3, N4, N5, N6, N7 and OUT. Respective level shifter cascaded inverters 234 are attached to the resistor divider string 201, with the first NFET 238 connected to ground GA, and the last PFET 266 connected to analog voltage AVDD, as shown. Each of the respective level shifter cascaded inverters 234 steps the voltage up by the amounts of AVDD divided by the number resistors or the voltage across each resistor shown in FIG. 2A or in a shown in FIG. 2C.

Figure 2C:
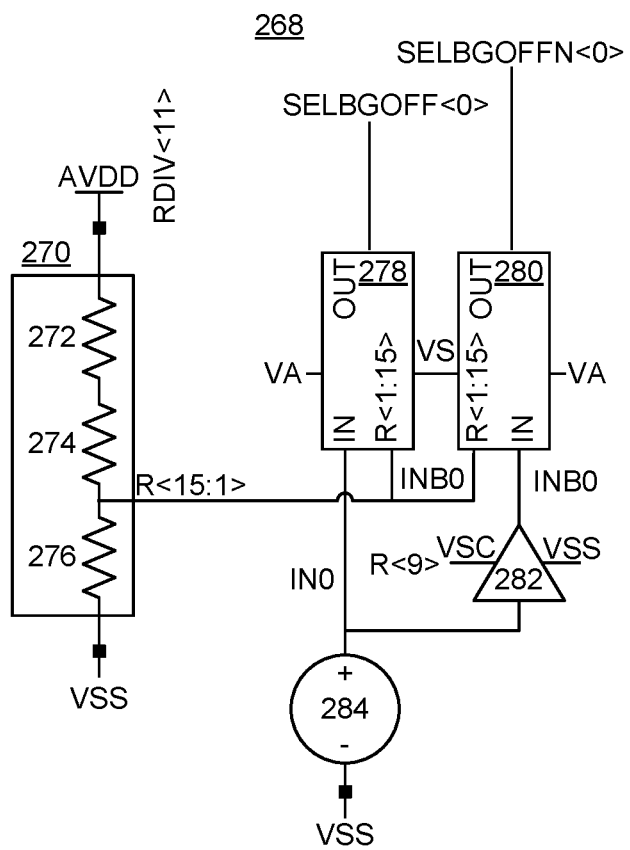

Referring now to FIG. 2C, circuit 100 includes an example level shifter LSHFT 268 including a resistor voltage divider 270 formed by a plurality of resistors 272, 274, 276 connected between voltage rails VSS, AVDD including a connection to the reference level R<15:1> applied to respective cascaded inverters 234. LSHFT 268 includes the resistor voltage divider 270 providing reference level R<15: 1> applied to a respective input INB0 or R<15:1> of logic functions 278, 280, each connected between voltage rails VSS, VA. An input IN of logic function 278 is connected to a source 184, with the input IN of logic function 280 connected to an inverted source output of an inverter 282. Logic functions 278, 280 provide respective outputs SELBGOFF <0>, SELBGOFFN <0>, there are shown illustrate example voltage outputs of the level shifter generally designated by respective reference characters 300, 400 in accordance with the preferred embodiment.

Referring to FIGS. 3 and 4, level shifter 268 of circuit 100 has a normal high indicated by line 302 and a normal low indicated by line 304 in FIG. 3.

In FIG. 4, level shifter 268 of circuit 100 has for no driving power supply VDD, a known high level indicated by line 402, which is the same as regular normal high level 302 shown in FIG. 3. Level shifter 268 of circuit 100 has for no driving power supply VDD, a known low level indicated by line 404, which is the same as the regular normal low level 304 shown in FIG. 3.

Referring now to FIGS. 5A, 5B, 5C, 5D, 5E, 5F, 5G, and 5H, there are shown example voltages within resistor divider string 201, level shifter cascaded inverters 234, and level shifter 268 of the circuit 100 in accordance with the preferred embodiment. Each of the level shifter cascaded inverters 234 steps the voltage up by amounts of the AVDD divided by the number of resistors or the voltage across each resistor in the resistor divider string 201, for example about 100 mV steps, for example, from an upper level of less than 1000 mV or 1 V in FIG. 5A, and the upper level of less than 1600 mV or 1.6 V in FIG. 5H, with a lower level of less than 200 mV or 0.2 V in FIG. 5A, and the lower level of less than 500 mV or 0.5.6 V in FIG. 5H.

Figure 5A:
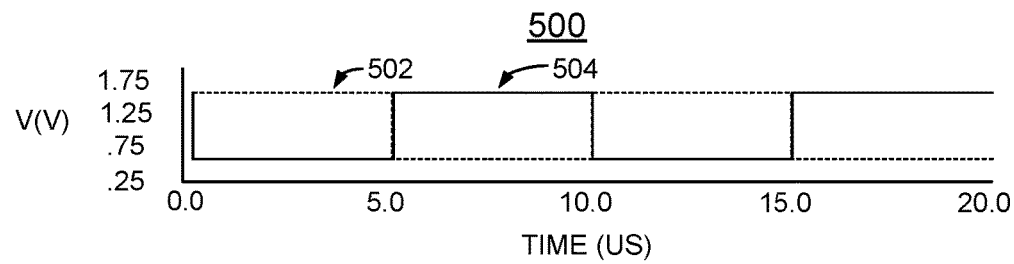
FIGS. 5A, 5B, 5C, 5D, 5E, 5F, 5G, and 5H illustrate example voltages in of the level shifter in accordance with the preferred embodiment.

FIG. 5A illustrates voltages generally designated by respective reference characters 500 including respective voltage outputs SELBGOFF <0> indicated by line 502, SELBGOFFN <0> indicated by line 504 of logic functions 278, 280 of level shifter 268 of the circuit 100.

Figure 5B:
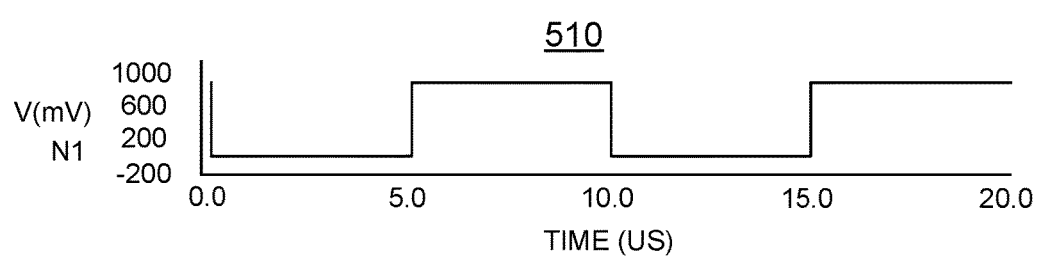

FIG. 5B illustrates voltages generally designated by respective reference characters 510 including voltage outputs at N1 of the level shifter cascaded inverters 234 of the circuit 100.

Figure 5C:
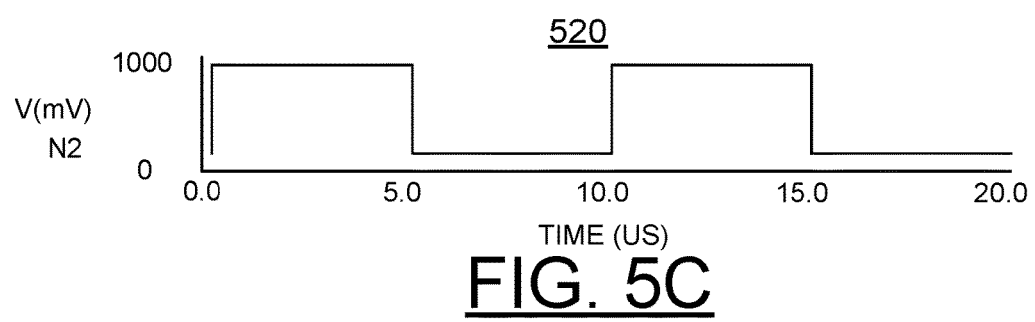

FIG. 5C illustrates voltages generally designated by respective reference characters 520 including voltage outputs at N2 of the level shifter cascaded inverters 234 of the circuit 100.

Figure 5D:
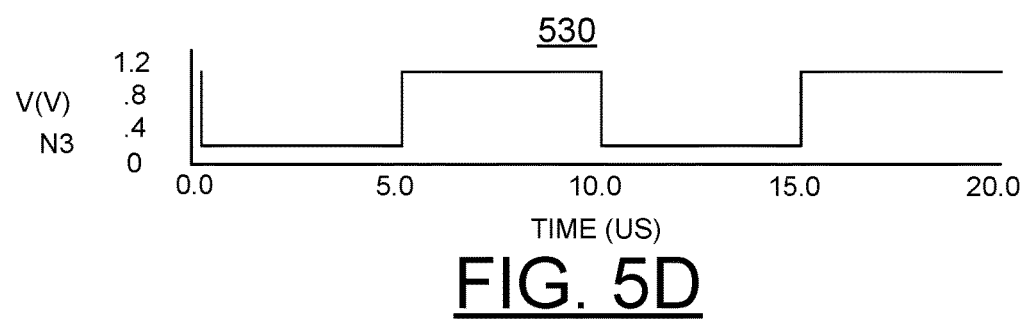

FIG. 5D illustrates voltages generally designated by respective reference characters 530 including voltage outputs at N3 of the level shifter cascaded inverters 234 of the circuit 100.

Figure 5E:
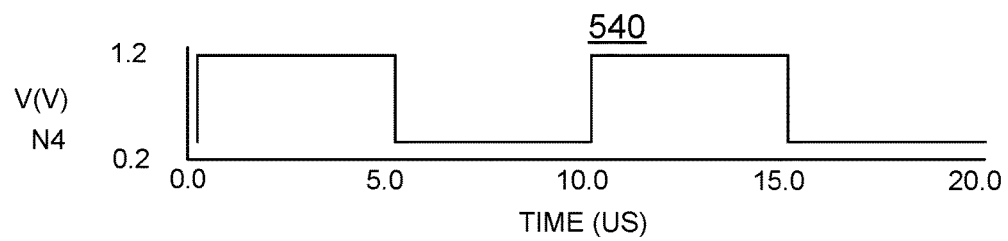

FIG. 5E illustrates voltages generally designated by respective reference characters 540 including voltage outputs at N4 of level shifter cascaded inverters 234 of the circuit 100.

Figure 5F:
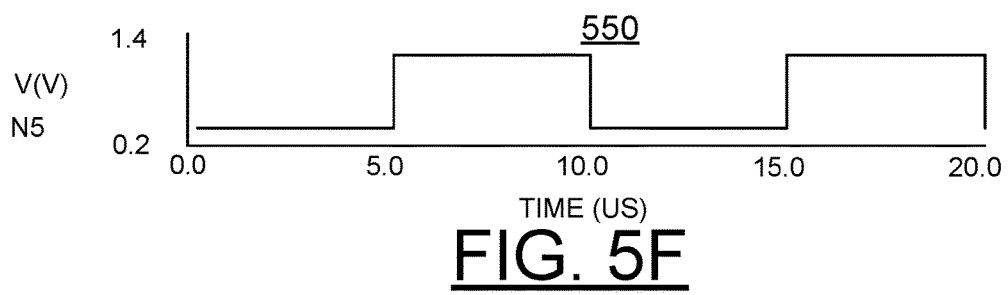

FIG. 5F illustrates voltages generally designated by respective reference characters 550 including voltage outputs at N5 of the level shifter cascaded inverters 234 of the circuit 100.

Figure 5G:
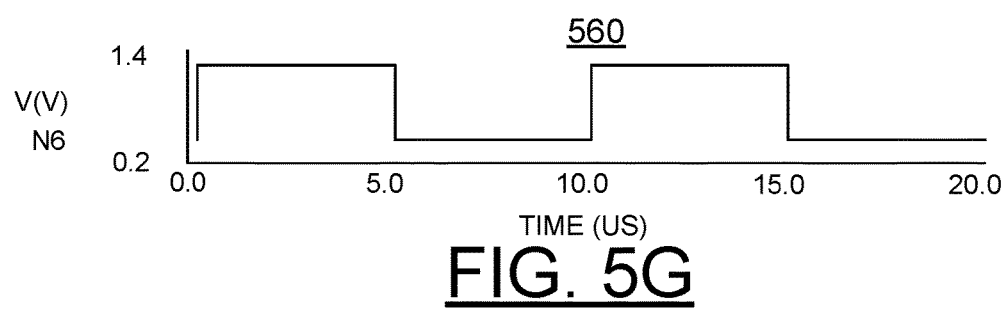

FIG. 5G illustrates voltages generally designated by respective reference characters 560 including voltage outputs at N6 of the level shifter cascaded inverters 234 of the circuit 100.

Figure 5H:
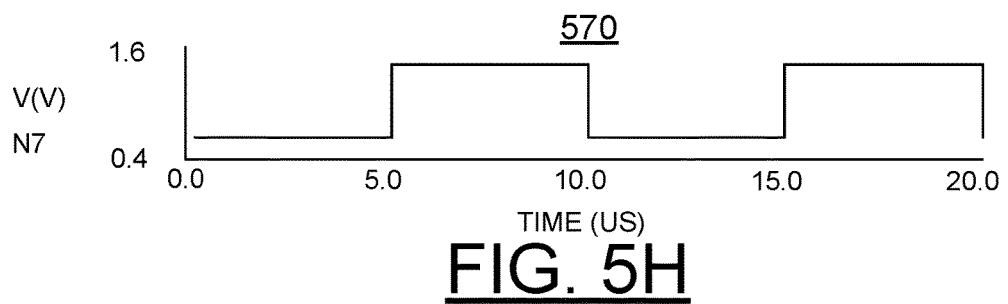

FIG. 5H illustrates voltages generally designated by respective reference characters 570 including voltage outputs at N7 of the level shifter cascaded inverters 234 of the circuit 100.

Figure 6:
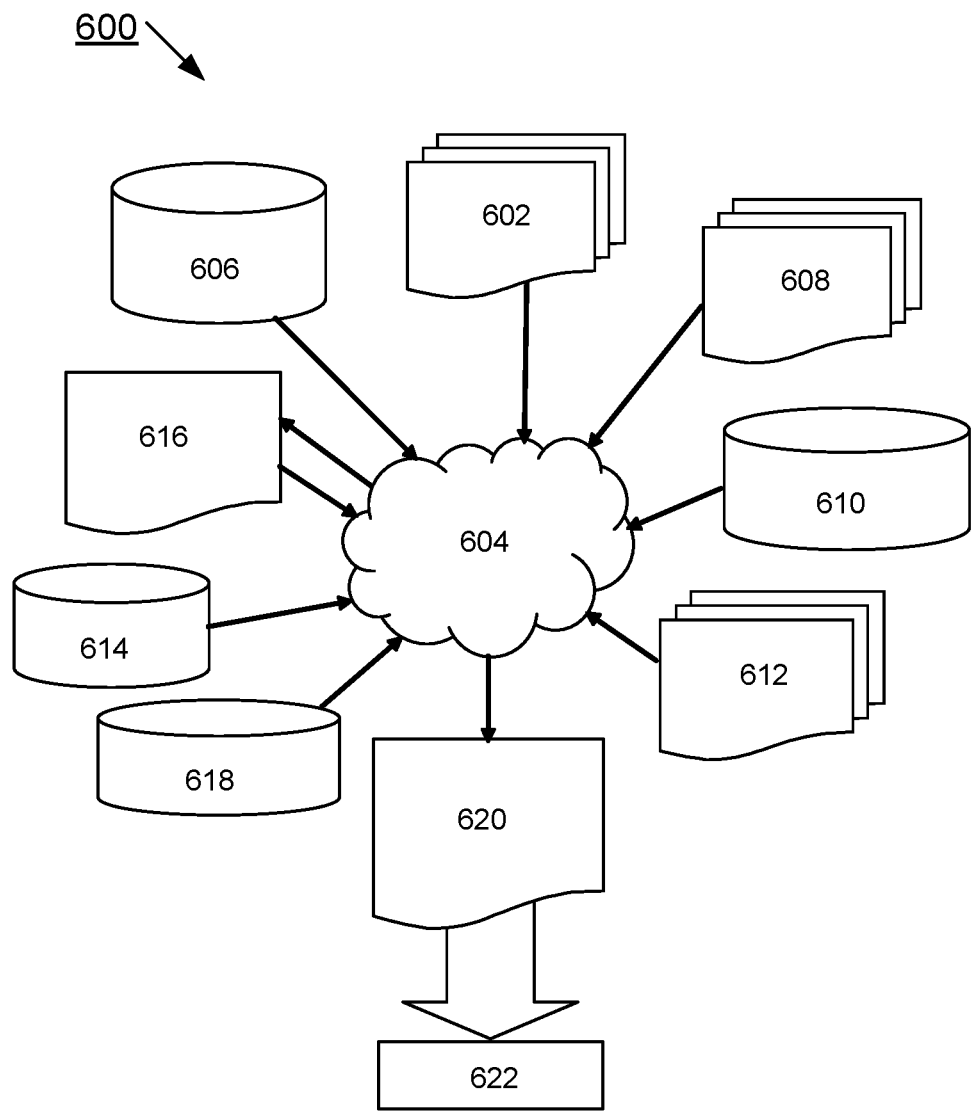
FIG. 6 is a flow diagram of a design process used in semiconductor design, manufacturing, and/or test.
Figure 7:
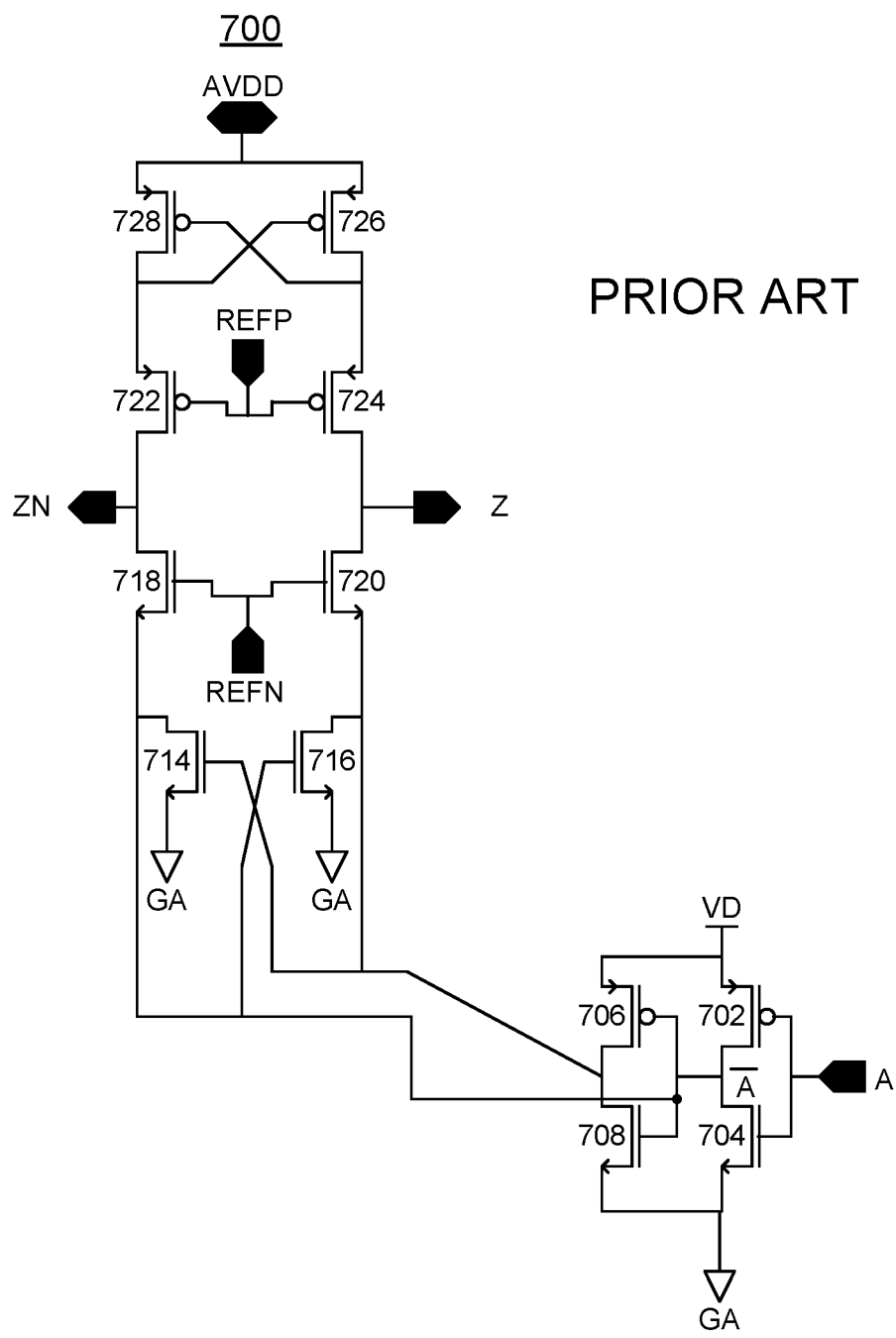
FIG. 7 illustrates a prior art level shifter.
Figure 8A:
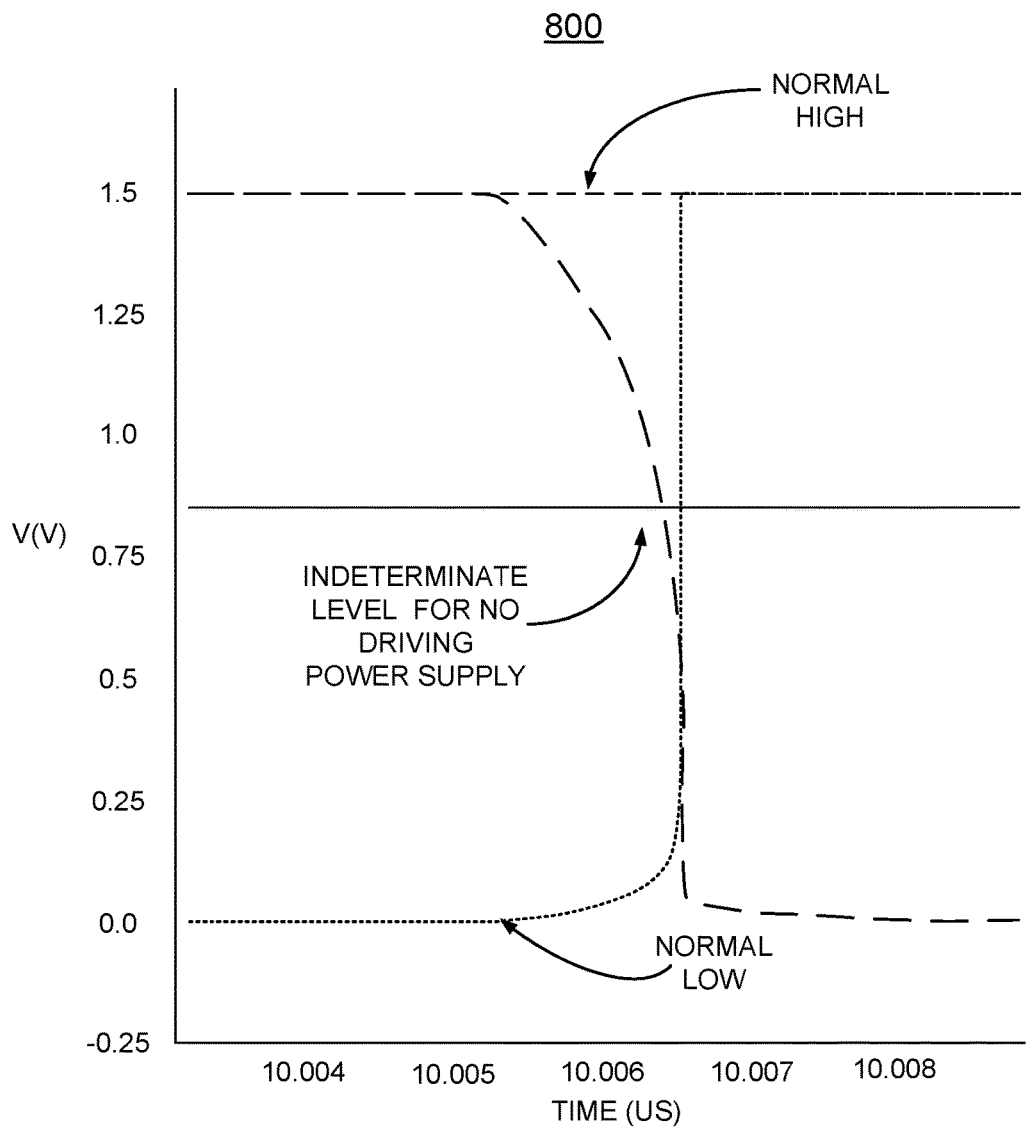
FIGS. 8A, 8B, and 8C illustrate example voltages of the prior art level shifter of FIG. 7.
Figure 8B:
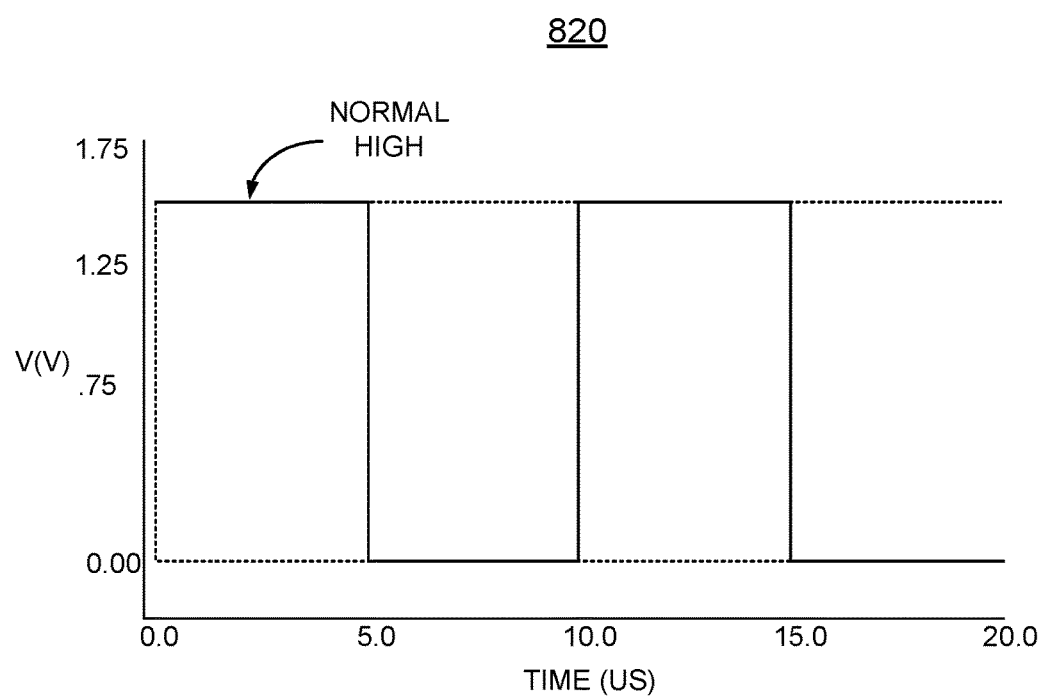
Figure 8C:
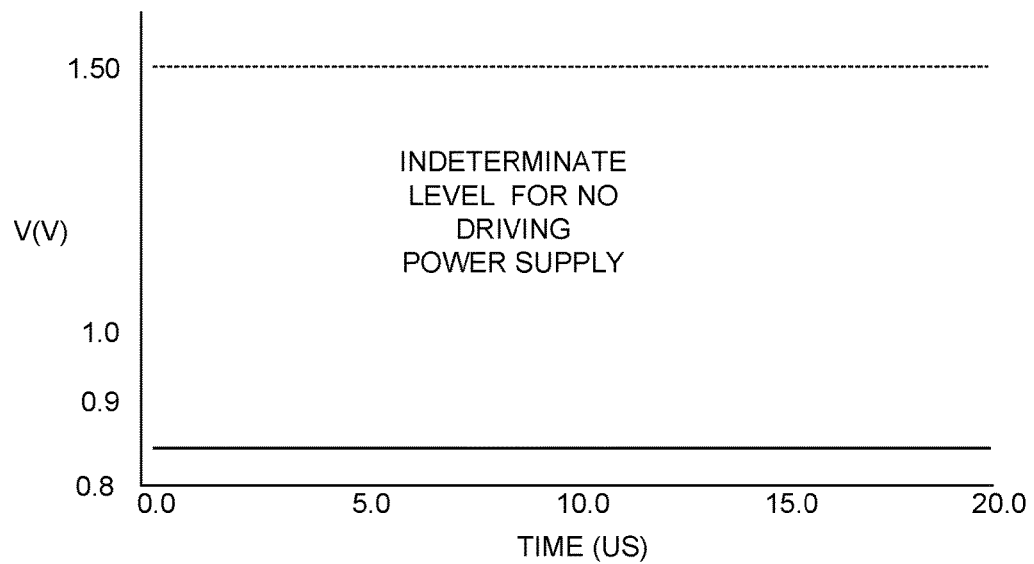

FIG. 6 shows a block diagram of an example design flow 600. Design flow 600 may vary depending on the type of IC being designed. For example, a design flow 600 for building an application specific IC (ASIC) may differ from a design flow 600 for designing a standard component. Design structure 602 is preferably an input to a design process 604 and may come from an IP provider, a core developer, or other design company or may be generated by the operator of the design flow, or from other sources. Design structure 602 comprises circuit 100 in the form of schematics or HDL, a hardware-description language, for example, Verilog, VHDL, C, and the like. Design structure 602 may be contained on one or more machine readable medium. For example, design structure 602 may be a text file or a graphical representation of circuit 100. Design process 604 preferably synthesizes, or translates, circuit 100 into a netlist 606, where netlist 606 is, for example, a list of wires, transistors, logic gates, control circuits, I/O, models, etc. that describes the connections to other elements and circuits in an integrated circuit design and recorded on at least one of machine readable medium. This may be an iterative process in which netlist 606 is resynthesized one or more times depending on design specifications and parameters for the circuit 100.

Design process 604 may include using a variety of inputs; for example, inputs from library elements 608 which may house a set of commonly used elements, circuits, and devices, including models, layouts, and symbolic representations, for a given manufacturing technology, such as different technology nodes, 10 nm, 14 nm, 22 nm, 32 nm, 45 nm, 90 nm, and the like, design specifications 610, characterization data 612, verification data 614, design rules 616, and test data files 618, which may include test patterns and other testing information. Design process 604 may further include, for example, standard circuit design processes such as timing analysis, verification, design rule checking, place and route operations, and the like. One of ordinary skill in the art of integrated circuit design can appreciate the extent of possible electronic design automation tools and applications used in design process 604 without deviating from the scope and spirit of the invention. The design structure of the invention is not limited to any specific design flow.

Design process 604 preferably translates an embodiment of the invention as shown in FIGS. 1A, 1B, 1C and 1D and FIGS. 2A, 2B, and 2C along with any additional integrated circuit design or data (if applicable), into a second design structure 620. Design structure 620 resides on a storage medium in a data format used for the exchange of layout data of integrated circuits, for example, information stored in a GDSII (GDS2), GL1, OASIS, or any other suitable format for storing such design structures. Design structure 620 may comprise information such as, for example, test data files, design content files, manufacturing data, layout parameters, wires, levels of metal, vias, shapes, data for routing through the manufacturing line, and any other data required by a semiconductor manufacturer to produce an embodiment of the invention as shown in FIGS. 1A, 1B, 1C and 1D and FIGS. 2A, 2B, and 2C. Design structure 620 may then proceed to a stage 622 where, for example, design structure 620 proceeds to tape-out, is released to manufacturing, is released to a mask house, is sent to another design house, is sent back to the customer, and the like.

While the present invention has been described with reference to the details of the embodiments of the invention shown in the drawing, these details are not intended to limit the scope of the invention as claimed in the appended claims.

What is claimed is:
1. A circuit for implementing a level shifter for translating logic signals to output voltage analog levels, said circuit comprising:

a bandgap circuit providing a series of outputs to a bandgap Analog multiplexer (AMUX);

the bandgap Analog multiplexer (AMUX) providing a multiplexer output to a bypass Resistor Divider (RDIV) AMUX;

the bypass Resistor Divider (RDIV) AMUX providing a selected output to a Phase-Locked-Loop (PLL), the selected output includes one of the bandgap AMUX multiplexer output and a resistor divider reference;

the Phase-Locked-Loop (PLL) providing a selected output voltage to a reference input of a regulator, the selected output voltage of the PLL responsive to the selected output of the bypass Resistor Divider (RDIV) AMUX;

a level shifter resistor divider string providing the resistor divider reference includes a plurality of series connected resistors;

said level shifter resistor divider string connected between an analog voltage rail and an analog ground;

a plurality of level shifter cascaded inverters connected between respective resistors of the level shifter resistor divider string, and between the analog voltage rail and the analog ground;

an output voltage of the level shifter programmed by the level shifter resistor divider string connected to the cascaded inverters.

2. The circuit as recited in claim 1 wherein the level shifter provides effective voltage translation and overvoltage protection, enabling use of thin oxide field effect transistors (FETs) in the level shifter.

3. The circuit as recited in claim 1 wherein the level shifter provides the output voltage being substantially identical when a driving power supply is high and when the driving power supply is low.

4. The circuit as recited in claim 1 wherein the level shifter provides the output voltage substantially independently of a state of a driving power supply.

5. The circuit as recited in claim 1 wherein the cascaded inverters are formed by respective series connected P-channel field effect transistor (PFET) and N-channel field effect transistor (NFET) pair connected between respective resistors of the level shifter resistor divider string.

6. The circuit as recited in claim 1 wherein the level shifter provides output voltages with voltages across pass gates low enough to turn on P-channel field effect transistors (PFETs) and turn off N-channel field effect transistors (NFETs), and the output voltages avoid an overvoltage condition, leakage and voltage stress on the transistors.

7. A design structure embodied in a non-transitory machine readable medium for designing, manufacturing, or testing an integrated circuit, the design structure comprising:
a circuit tangibly embodied in the non-transitory machine readable used in a design process, said circuit for implementing a level shifter for translating logic signals to output voltage analog levels, said circuit comprising:
a bandgap circuit providing a series of outputs to a bandgap Analog multiplexer (AMUX);
the bandgap Analog multiplexer (AMUX) providing a multiplexer output to a bypass Resistor Divider (RDIV) AMUX;
the bypass Resistor Divider (RDIV) AMUX providing a selected output to a Phase-Locked-Loop (PLL), the selected output includes one of the bandgap AMUX multiplexer output and a resistor divider reference;
the Phase-Locked-Loop (PLL) providing a selected output voltage to a reference input of a regulator, the selected output voltage of the PLL responsive to the selected output of the bypass Resistor Divider (RDIV) AMUX;
a level shifter resistor divider string providing the resistor divider reference includes a plurality of series connected resistors;
said level shifter resistor divider string connected between an analog voltage rail and an analog ground;
a plurality of level shifter cascaded inverters connected between respective resistors of the level shifter resistor divider string, and between the analog voltage rail and the analog ground; and
an output voltage of the level shifter being programmed by the level shifter resistor divider string connected to the cascaded inverters, wherein the design structure, when read and used in the manufacture of a semiconductor chip produces a chip comprising said circuit.

8. The design structure of claim 7, wherein the design structure comprises a netlist, which describes said circuit.

9. The design structure of claim 7, wherein the design structure resides on storage medium as a data format used for the exchange of layout data of integrated circuits.

10. The design structure of claim 7, wherein the design structure includes at least one of test data files, characterization data, verification data, or design specifications.

11. The design structure of claim 7, wherein the level shifter provides effective voltage translation and overvoltage protection, enabling use of thin oxide field effect transistors (FETs) in the level shifter.

12. The design structure of claim 7, wherein the level shifter provides the output voltage being substantially identical when a driving power supply is high and when the driving power supply is low.

13. The design structure of claim 7, wherein the level shifter provides the output voltage substantially independently of a state of a driving power supply.

14. The design structure of claim 7, wherein the cascaded inverters are formed by respective series connected P-channel field effect transistor (PFET) and N-channel field effect transistor (NFET) pair connected between respective resistors of the level shifter resistor divider string.

15. The design structure of claim 7, wherein the level shifter provides output voltages with voltages across pass gates low enough to turn on P-channel field effect transistors (PFETs) and turn off N-channel field effect transistors (NFETs), and the output voltages avoid an overvoltage condition, leakage and voltage stress on the transistors.

16. A method for implementing a level shifter for translating logic signals to output voltage analog levels, said method comprising:
providing a bandgap circuit providing a series of outputs to a bandgap Analog multiplexer (AMUX);
the bandgap Analog multiplexer (AMUX) providing a multiplexer output to a bypass Resistor Divider (RDIV) AMUX;
the bypass Resistor Divider (RDIV) AMUX providing a selected output to a Phase-Locked-Loop (PLL), the selected output includes one of the bandgap AMUX multiplexer output and a resistor divider reference;
the Phase-Locked-Loop (PLL) providing a selected output voltage to a reference input of a regulator, the selected output voltage of the PLL responsive to the selected output of the bypass Resistor Divider (RDIV) AMUX;
providing the resistor divider reference includes providing a level shifter resistor divider string of a plurality of series connected resistors;

connecting the level shifter resistor divider string between an analog voltage rail and an analog ground connecting a plurality of level shifter cascaded inverters between respective resistors of the level shifter resistor divider string, and between the analog voltage rail and the analog ground; and programming an output of the level shifter by the level shifter resistor divider string connected to the cascaded inverters.

17. The method as recited in claim 16 includes forming the cascaded inverters by respective series connected P-channel field effect transistor (PFET) and N-channel field effect transistor (NFET) pair connected between respective resistors of the level shifter resistor divider string.

18. The method as recited in claim 16 includes limiting an output level of analog output voltages to provide voltages across pass gates low enough to turn on P-channel field effect transistors (PFETs) and turn off N-channel field effect transistors (NFETs), and the output voltages avoid an overvoltage condition, leakage and voltage stress on the transistors.

19. The method as recited in claim 16 includes providing the output voltage of the level shifter substantially independently of a state of a driving power supply.

20. The method as recited in claim 16 includes the level shifter providing effective voltage translation and overvoltage protection, enabling use of thin oxide field effect transistors (FETs) in the level shifter.

* * * * *